US007409609B2

United States Patent
Haufe (10) Patent No.: US 7,409,609 B2
(45) Date of Patent: Aug. 5, 2008

(54) INTEGRATED CIRCUIT WITH A CONTROL INPUT THAT CAN BE DISABLED

(75) Inventor: Juerg Haufe, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 303 days.

(21) Appl. No.: 11/079,889

(22) Filed: Mar. 14, 2005

(65) Prior Publication Data

US 2006/0212765 A1   Sep. 21, 2006

(51) Int. Cl.
*G01R 31/28* (2006.01)

(52) U.S. Cl. .................................................. 714/724

(58) Field of Classification Search ........................ None
See application file for complete search history.

(56) References Cited

U.S. PATENT DOCUMENTS 7,039,838 B2 *   5/2006   Proell et al. .................. 714/724

2004/0237013 A1 *   11/2004   Larson et al. ................ 714/724
2005/0149788 A1 *   7/2005   Jeon et al. .................... 714/724

FOREIGN PATENT DOCUMENTS

DE        103 13 872 B3    6/2004
WO       WO 03/102963 A1   12/2003

* cited by examiner

*Primary Examiner*—Christine T Tu
(74) *Attorney, Agent, or Firm*—Slater & Matsil, L.L.P.

(57) ABSTRACT

An integrated circuit comprises a control unit, a plurality of control inputs for the provision of control signals to said control unit and a deactivation circuit for disabling the provision of at least one of said control signals. After reception of a first coded message by said integrated circuit the provision of at least one of said control signals to the control unit can be disabled by said deactivation circuit.

18 Claims, 4 Drawing Sheets

INTEGRATED CIRCUIT WITH A CONTROL INPUT THAT CAN BE DISABLED

TECHNICAL FIELD

The present invention relates generally to integrated circuits, and more particularly to an integrated circuit with a control input that can be disabled.

BACKGROUND

Many integrated circuits (ICs) include a control input for receiving an enabling signal, which is used for activating or deactivating the IC. Such ICs are useful in situations in which ICs are connected and operated in parallel. An example is a plurality of ICs connected to a common communication bus. Another example, where the disabling of individual ICs connected in parallel is important, are chips that are being tested in parallel after manufacturing. Yet another example are ICs that provide functionality, which should only be available in a special test mode, but remain disabled in a normal operation mode.

For example, many chips provide a chip enable (CE) pin, which will activate the IC once a voltage of a predefined level, e.g., 5 V, is supplied to the CE pin. Otherwise the IC is not active or deselected, e.g., if the CE pin is connected to electrical ground.

Such an arrangement is suited for a situation where several chips are connected to a common bus and one chip is selected by a bus arbitrator. The bus arbitrator can be implemented, for example, as a bus controller or a processor controlling the bus. However, such an arrangement requires one control line connected to the CE pin of each integrated circuit on the bus. For example, many memory modules can be connected in parallel, i.e., use the same data and address lines. In order to address the individual modules of a memory bank individually, a control chip decodes the address values and activates only one of the memory modules at a time using a control signal sent to the corresponding memory module. In situations where many integrated circuits are connected and operated in parallel this results in a complicated and thus costly design.

In the second example of chip testing, this is particularly disadvantageous. There, many chips execute test sequences in parallel, controlled by a controller of the testing arrangement. During testing, all chips, which are also called "devices under testing" (DUT), are active and execute the same test sequence. For cost reasons as many chips as possible should be tested at the same time.

However, once a DUT has been identified as being defective, it needs to be excluded from further testing for two reasons. Firstly, to avoid a corruption of further test results through the defective device and, secondly, to preserve the defective device in the erroneous state for further analysis. Thus, the device needs to be deactivated.

If the control lines, e.g., the line connected to the CE pin, of all DUTs were connected in parallel, such an individual deselection would not be possible at all. As a consequence, the defective device would need to be physically removed from the testing arrangement, which is infeasible for a variety of reasons. Firstly, the DUTs are mounted in large testing arrangements, which are contained in a climatic chamber preventing direct access. Secondly, tests are executed continuously in a test run and interrupting the test run would invalidate the results obtained from the non-defective devices as well. Lastly, such a manual interference would be too tedious and costly in a manufacturing environment. Consequently a defective DUT cannot be excluded from further tests and kept in its erroneous state. This is particularly disadvantageous in the testing of non-volatile memory modules. In addition, having to keep a device known to be defective in a testing arrangement can also affect subsequent tests adversely.

In an improved testing arrangement, the controller of the testing arrangement allows the selection or deselection of every DUT. However, this requires a separate line between the controller and each control input of each DUT used in the test. Usually the controller of the testing arrangement will provide only a limited number of control outputs. For example, there are controllers that provide up to a few hundred control outputs. However, many DUTs require a multitude of control signals to be provided, e.g., a chip might comprise 16 control input pins. As a consequence such testing arrangements are limited to a few chips to be tested in parallel, e.g., one per 16 control outputs of the controller of the testing arrangement for chips with 16 control inputs.

In a further refinement of the testing arrangement the DUTs are arranged in an array and a combination of two or more signals are used to activate a particular DUT. Consequently, the control outputs available to a controller of the testing arrangement can be used more efficiently. For example, a controller with 390 control outputs is used to provide an array of 16 rows and 15 columns, totaling 240 DUTs. Each DUT is provided with a multitude of control input signals, i.e., 15 control signals per row of the testing arrangement and 2 signals per column of the testing arrangement.

In another exemplary arrangement, all the CE pins of a column of DUTs are connected together to one control output of the controller. In addition, all command latch enable (CLE) pins common to a row of DUTs are connected to another control output of the controller. Because a chip will only react to a command provided to it if both the CLE and CE pins are connected to a predefined voltage, a single DUT can be enabled by selecting the control output of the controller connected to the line supplying the CE and CLE pins corresponding to the column and the row of the DUT in question. At the same time it is possible to enable all DUTs by selecting all columns and rows at the same time.

These two options are used in combination, for example, during the testing of memory chips. In a first phase all DUTs are enabled and a command is issued to all of them to write a particular test pattern into the memory of the DUTs. In a second phase each DUT is enabled individually and the written pattern is read in and verified. Alternatively, the DUT can comprise a status register, which can be read out by the test controller and provides a status value for the last operation, i.e., whether the operation was completed successfully or failed with an error. Because the reading process is performed much faster than the writing process, the individual selection during the reading process does not slow down the test significantly.

However, if one DUT is known to be defective, it cannot be excluded from further write operations in this arrangement. At best a complete row or column can be deselected by disabling the corresponding control output of the testbed controller. In this case all other devices in the same row or column are excluded from further tests as well, which is equally disadvantageous.

SUMMARY OF THE INVENTION

In one aspect, the current invention provides an integrated circuit, which can be deactivated individually even if it is operated in parallel with other integrated circuits of the same type.

In another aspect, the current invention provides an integrated circuit, which can be more flexible, by allowing to disable or modify the way the integrated circuit reacts to externally provided control signals.

According to one aspect of the present invention an integrated circuit includes a control unit, a plurality of control inputs for the provision of control signals to the control unit and a deactivation circuit. The deactivation circuit can disable the provision of the control signals from at least one control input to the control unit. The deactivation circuit is activated by a predefined pattern of control signals provided to the control inputs, which are also connected to the deactivation circuit.

In the described testing arrangement, such an integrated circuit could be deactivated individually and thus excluded from further testing. An individual DUT, once identified as being defective, can be selected individually by selecting the control outputs of the controller of the testing arrangement corresponding to the row and the column of the defective DUT. In a further step the predefined pattern of control signals can be sent to the selected DUT to disable the provision of control signals responsible for enabling the DUT in further tests. The test could then be resumed, but activating the control outputs corresponding to the row and column of the defective DUT would not enable the defective DUT for further tests, e.g., write operations.

In a further embodiment of the invention, the provision of control signals disabled in the inventive manner can be re-enabled by a second predefined pattern of control signals sent to the DUT. For example, the second combination of predefined control signals could be sent to the control inputs of the defective DUT in a further testing stage, where the reasons of the failure of DUT are analyzed in detail.

In another aspect of the present invention, an integrated circuit comprises a processor, a plurality of control inputs for the provision of control signals to the processor, a deactivation circuit and an input for receiving program instructions. The control inputs and the input for receiving program instructions are connected to the processor and the program instructions are executable by the processor. The processor is also connected to the deactivation circuit, which can be used to disable the provision of at least one of the control signals. The deactivation circuit is activated once a predefined program instruction is executed by the processor.

Such an embodiment of the present invention is particularly useful in the case of processors or microcontrollers, which are controlled by software commands. The described embodiment allows to effectively disable a physical control input of such a device by issuing a software command.

In another embodiment of the present invention, the previously disabled provision of control signals can also be re-enabled by issuing a second program instruction to the processor.

In a third aspect of the present invention, an integrated circuit includes a control unit, a plurality of control inputs for providing control signals to the control unit, a deactivation circuit and a control register storing a control value. Again the control inputs are connected to the control unit. The control register is connected both to the control unit and the deactivation circuit. The provision of control signals from the control inputs to the control unit can be disabled by storing a first predefined value in the control register.

In a further embodiment of the present invention, the provision of control signals can be re-enabled by storing a second predefined value in the control register.

The previous two embodiments of the present invention can be implemented using either a processor or a memory device. In both cases, a particular memory cell, like a register of a processor or predefined cell of a memory device, is used to control the deactivation means.

In a further embodiment the memory cell used to store the value of the control register may be part of a non-volatile memory element. In this case the current state of the deactivation means can be preserved even if the supply voltage to the integrated circuit is interrupted.

In the special case of the integrated circuit being a memory device, one or more control inputs connected to the integrated circuit can be used to switch between a full write access mode and read-only access mode of the memory device. In the previously described testing environment, no further writing operation should be allowed on the chip once it has been identified as being defective. In such a situation it is advantageous to disable the provision of control signals responsible for activating a write process using the inventive deactivation means. Similarly, a control input of the integrated circuit, which controls the deletion of the memory content, can be deactivated.

The deactivation means required in each aspect of the present invention can be implemented using different approaches. For example an electronic switch, formed for example by a transistor included in an electrical connection between a control input and a controller, can be used to disable the provision of control signals. Such an electronic switch can be internal or external to the inventive integrated circuit. Alternatively, a processor can be equipped with a table used to map externally received instructions to processor internal micro-operations. By modifying the content of the mapping table, the sequence of micro-operations executed in response to a provided instruction can be altered and potentially replaced with an empty sequence, so that an incoming control signal has no effect whatsoever on the processor.

If only a single disablement of the control input is required without the option of re-enabling the control input later on, a microscopic fuse inside the integrated circuit can be blown by applying a high current to the fuse, which will permanently interrupt the line in which the fuse is provided. This is particularly useful if a particular control input of the processor or control unit is only required in a test mode of the integrated circuit, but should remain in a disabled state once testing is completed.

Further details and embodiments of the present invention will be explained using the following figures.

BRIEF DESCRIPTION OF THE DRAWINGS

For a more complete understanding of the present invention, and the advantages thereof, reference is now made to the following descriptions taken in conjunction with the accompanying drawings, in which:

FIG. 7, which includes

DETAILED DESCRIPTION OF ILLUSTRATIVE EMBODIMENTS

Figure 1:
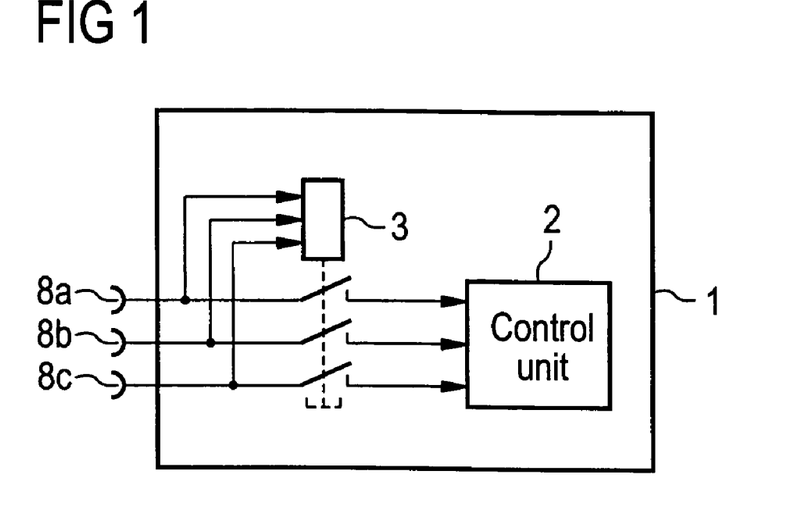
FIG. 1 shows a schematic diagram of a first embodiment of the present invention in which the provision of control signals from three control inputs can be disabled by the use of a predefined combination of control signals.

FIG. 1 shows a first embodiment of the present invention. An integrated circuit 1 includes a control unit 2 and a deactivation circuit 3. It further includes a plurality of control inputs 8a, 8b and 8c for the provision of input signals to the control unit 2. In the illustrated embodiment of the present invention, the provision of control signals from all three control lines 8a, 8b and 8c can be disabled together by the deactivation circuit 3. The deactivation circuit 3 is also coupled to the control inputs 8a, 8b and 8c. The deactivation circuit 3 is activated once a particular combination of control signals is received from the three control inputs 8a, 8b and 8c, for example a high voltage level, e.g., 3.3V, on all three control inputs 8a, 8b and 8c. Once the deactivation circuit 3 has been activated the control unit 2 does not receive any further input signals from the control inputs 8.

Because the deactivation circuit 3 is connected to the plurality of control inputs 8 directly, the deactivation circuit 3 can still receive input signals from the control inputs 8. Thus, in the embodiment shown in FIG. 1, the deactivation circuit 3 can also be deactivated. As a consequence, the control inputs 8 are enabled to provide the control unit 2 with input signals again. For example, the same input signal pattern as above could be used, i.e., a high voltage, provided to all the control inputs 8a, 8b and 8c. Alternatively, a different pattern can be used to deactivate the deactivation circuit 3 than was used to activate this circuit.

In order to avoid an interference of the combinations of control signals used for activation and deactivation of the deactivation circuit 3 with the functions provided by the control unit 2, neither combination must be used by any function of the control unit 2. In an alternative embodiment, control signals can be supplied to the control inputs 8, which are completely out with the specification of the integrated circuit 1, for example a negative voltage being supplied to the control inputs 8 of an integrated circuit 1 usually working with control signals having a positive voltage. As another example, an over voltage (e.g., a voltage greater than the high logic level) can be used to activate or deactivate circuit 3.

Figure 2:
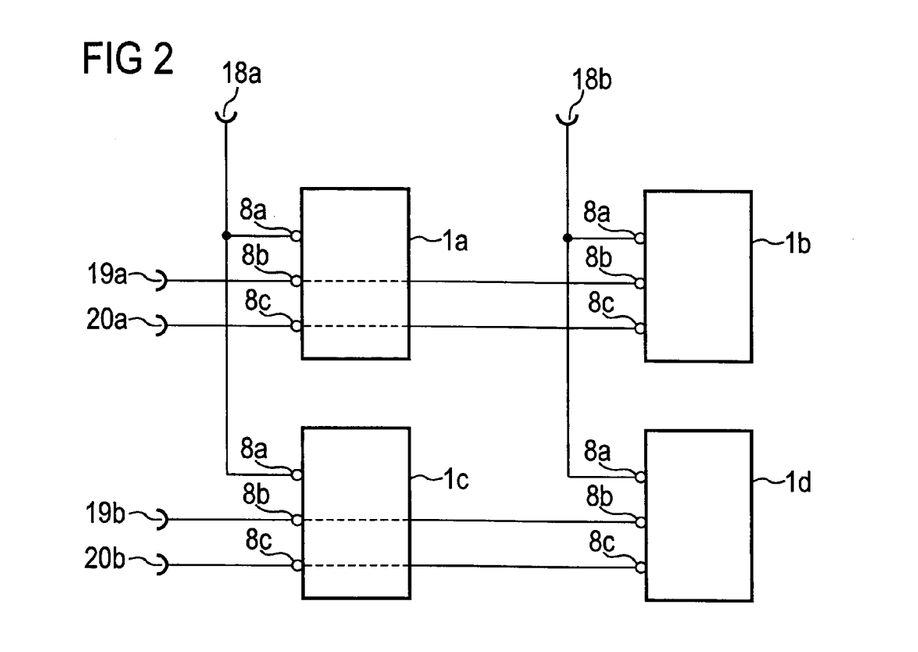
FIG. 2 shows an arrangement of four integrated circuits according to the first embodiment of the present invention, in which a single integrated circuit can be deactivated.

FIG. 2 shows an arrangement of four inventive integrated circuits 1 arranged in a two-by-two array. Each integrated circuit 1 has an identical internal setup, for example as shown in FIG. 1 and described above. In order to distinguish the four integrated circuits, they are labeled 1a, 1b, 1c and 1d respectively. The arrangement could be used, for example, in a testing array arrangement as described in the background section.

In order to enable individual addressing of the individual integrated circuits 1, the first control inputs 8a of each column of integrated circuits 1 are connected to a common control line 18, i.e., the control inputs 8a of the integrated circuits 1a and 1c are connected to control line 18a and those of the integrated circuits 1b and 1d are connected to control line 18b. In addition, the control inputs 8b of the first row of integrated circuits 1 comprising integrated circuit 1a and 1b are connected to a common control line 19a and the control inputs 8b of the integrated circuits 1c and 1d of the second row are connected to a common control line 19b. Finally, the third control inputs 8c of the integrated circuits 1a and 1b are connected to a common control line 20a, and the control inputs 8c of the second row comprising integrated circuits 1c and 1d are connected to a common control line 20b.

The integrated circuits 1 could, for example, be non-volatile memory chips. In the given example the first control input 8a is used to provide a chip enable signal, the second control input 8b is used to indicate a read operation and the third control input 8c is used to indicate a write operation. In normal operation, i.e., reading or writing the memory chip 1 the control inputs 8b and 8c are not enabled together.

Figure 3:
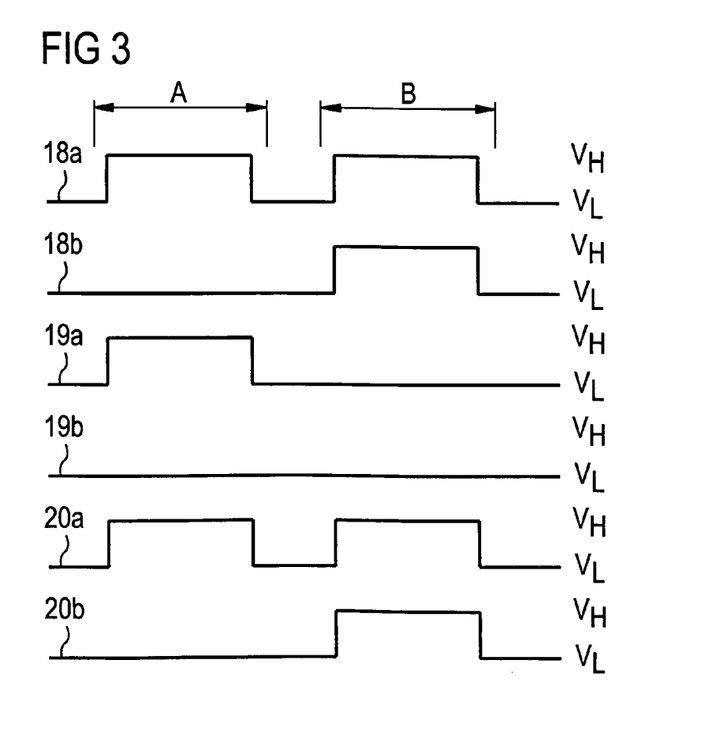
FIG. 3 shows a sequence of control signals sent to the arrangement of FIG. 2 to first deactivate a first integrated circuit and then send a combination of control signals to all other integrated circuits.

FIG. 3 shows a sequence of control signals provided to the control lines 18, 19 and 20 connected to the integrated circuits 1. In a first phase A, the integrated circuit 1a is deactivated. In a second phase B, all integrated circuits 1 receive a common set of control signals 18, 19 and 20 indicating a write operation, but only the integrated circuits 1b, 1c and 1d that have not been deactivated react to it.

In the following example it is assumed that the integrated circuit 1a should be deactivated, e.g., because it has been identified as being defective in an earlier test. To this end all control inputs 8a, 8b and 8c of the device 1a need to receive a high voltage signal, but none of the other device 1b, 1c or 1d should receive the same control signal.

In the arrangement shown in FIG. 2 this can be achieved by providing a positive voltage $V_H$, e.g., 3.3V, to the control lines 18a, 19a and 20a. The other control lines 18b, 19b and 20b are connected to another voltage potential $V_L$, e.g. electrical ground.

As described above, this will disable the provision of all further control signals from the control inputs 8a, 8b and 8c to the control unit 2 of the integrated circuit 1a. However, none of the other integrated circuits 1b, 1c or 1d will be deactivated or perform any function. The integrated circuit 1b does not receive a chip enable signal on its control input 8a and thus ignores the control signals received at its control inputs 8b and 8c. The integrated circuit 1c received a chip enable signal, but neither a write nor a read signal on its control inputs 8b and 8c respectively. Finally, the integrated circuit 1d does not receive any control signals in step A.

In step B, all integrated circuits 1 receive a common pattern of control inputs, i.e., a chip enable and a write access signal to indicate a write operation. To this end both control lines 18a and 18b, selecting the first and second column, and the control lines 20a and 20b, selecting the write operation of the integrated circuits 1 in the first and second row are supplied with $V_H$. At the same time the control lines 19a and 19b remain on potential $V_L$.

The data to be written and its address are provided by a data bus and an address bus, which are not shown in FIG. 2 for reasons of representational simplicity. They are, however, assumed to be connected in parallel for all integrated circuits 1 in order to minimize the number of lines used in the testing arrangement.

In phase B, the controller 2 of the integrated circuit 1a does not receive any of the control signals received at the control inputs 8a, 8b and 8c of the integrated circuit 1a, because the deactivation circuit 3 has been activated in step A, disabling the provision of control signals. Consequently, the integrated circuit 1a does not execute the write operation but preserves its internal state, for example for failure analysis.

The controllers 2 of the integrated circuits 1b, 1c and 1d, which have not been deactivated in the previous step A, receive and react to the control signals provided to the control inputs 8a, 8b and 8c as normal, i.e., they execute the write operations according to the information provided on the data and address buses.

Figure 4:
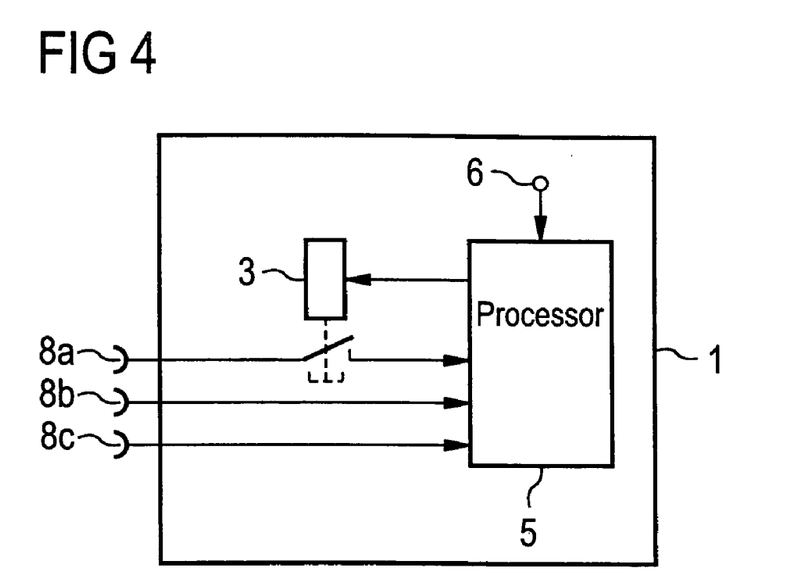
FIG. 4 shows a schematic diagram of a second embodiment of the present invention in which the provision of control signals from a single control input can be disabled by a processor integrated into an IC.

FIG. 4 shows a second embodiment of the present invention. An integrated circuit 1 comprises a processor 5 and a deactivation circuit 3. In the presented embodiment, three control inputs 8a, 8b and 8c are connected to the processor 5. The processor 5 is further connected to an input 6 for receiving program instructions. The processor 5 is also connected to the deactivation circuit 3. In the embodiment presented in FIG. 4 only the provision of control signals from one control input 8a can be disabled using the deactivation circuit 3.

The deactivation circuit 3 is controlled by the processor 5. Upon receiving a predefined program instruction from the input 6, the processor 5 will activate the deactivation circuit 3 and in this way disable the control input 8a. The program instruction triggering the disablement of control input 8a can be loaded from an internal storing program instruction or may be provided externally to the integrated circuit 1.

In the embodiment shown in FIG. 4, a second program instruction can be provided, which can be used to deactivate the deactivation circuit 3 and thus re-enable the provision of control signals using the control input 8a.

In a variation of the previous embodiment, the integrated circuit 1 can be identified using a unique identifier, i.e., the serial number of a processor or the like. The first and, if provided, the second program instruction used to activate or deactivate the deactivation circuit 3 can be parameterized to include an identifier as parameter. Upon receiving such a program instruction, the processor 5 will compare the received identifier with its own identifier and only activate or deactivate the deactivation circuit 3, if the two identifiers are equal.

In the embodiment of FIG. 1, three control signals are capable of being disabled while in the embodiment of FIG. 4 only one control signal, could be disabled. It is understood that either embodiment could be modified to disable whatever number of signals (control or otherwise) that are desired. This same statement applies to the further embodiments, which will be described now.

Figure 5:
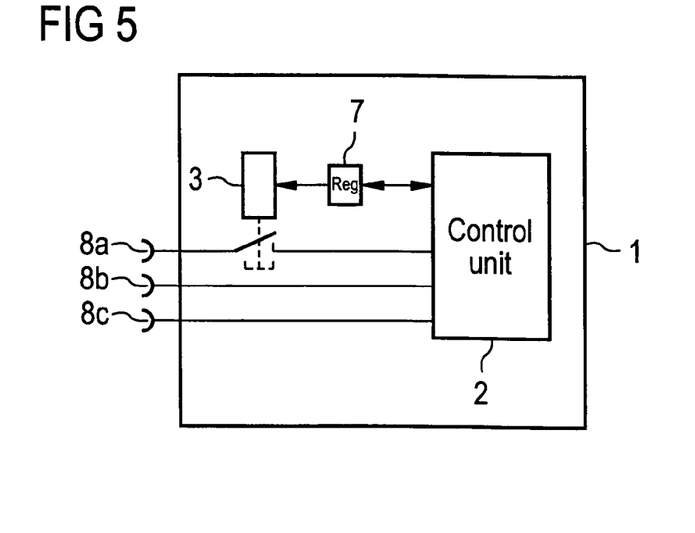
FIG. 5 shows a schematic diagram of a third embodiment of the present invention in which the provision of control signals from a single control input is controlled by a control register.

FIG. 5 shows a third embodiment of the present invention. An integrated circuit 1 comprises a control unit 2 and a deactivation circuit 3. The integrated circuit 1 further comprises three control inputs 8a, 8b and 8c, which are connected to the control unit 2. Only the provision of control signals from one of these control inputs 8, the control input 8a can be disabled by using the deactivation circuit 3. The deactivating circuit 3 is controlled by a control register 7, which is connected to the control unit 2.

The deactivation circuit 3 is activated once a first predefined value is written into the control register 7. The writing of the predefined first value into the control register 7 can be triggered for example by the control unit 2 or using a combination of input signals provided to the control inputs 8 or by directly writing a new value into the control register 7 using an address bus and a data bus to the integrated circuit 1, which are not shown in FIG. 5.

In the embodiment shown in FIG. 5 the deactivation circuit 3 can be deactivated by providing a second predefined value to the control register 7. The value can be provided using the same means as indicated above.

Figure 6:
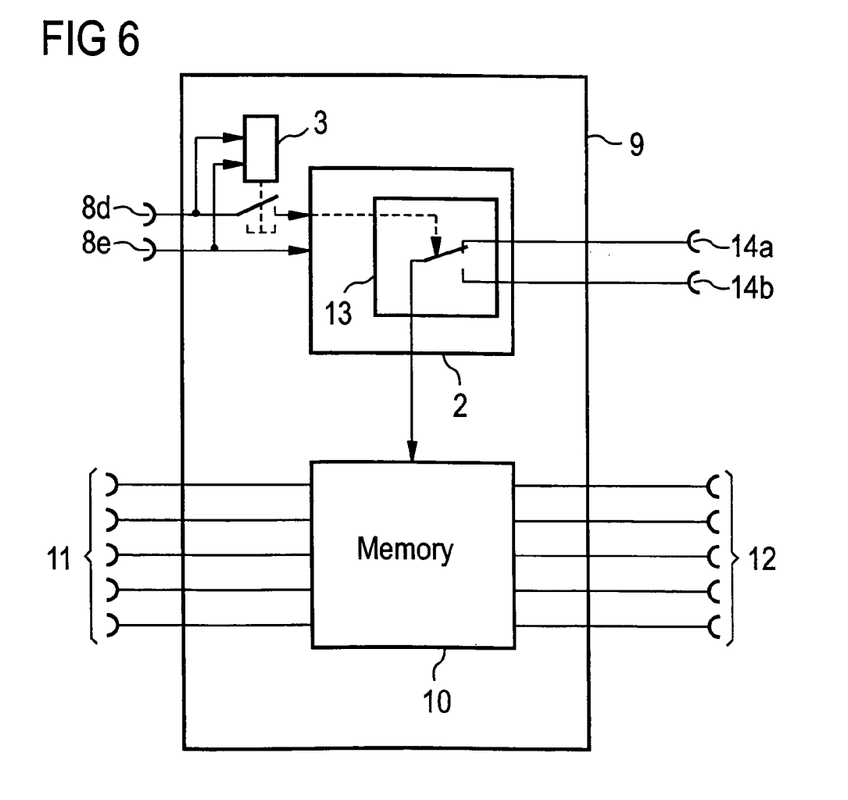
FIG. 6 shows a schematic diagram of a fourth embodiment of the present invention in which a non-volatile, rewriteable memory chip can be switched into a read-only mode.

FIG. 6 shows a fourth embodiment of the present invention. A memory device 9 comprises a control unit 2, a deactivation circuit 3 and a non-volatile memory module 10. The memory module 10 is coupled to an address bus 11 and a data bus 12. Both the control unit 2 and the deactivation circuit 3 are coupled to two control inputs 8d and 8e.

Control input 8d provides a high voltage signal to the control unit 2 in case of write access to the memory module 10, control input 8e provides a chip enable signal to the control unit 2, which activates the memory device 9.

The control unit 2 comprises an electronic switch 13, which selects either a first voltage 14a or a second voltage 14b for supplying the memory module 10 with an operating voltage. The first voltage 14a is used to operate the non-volatile memory module 10 for reading. The second voltage 14b is used to operate the memory module 10 for writing.

In the embodiment shown in FIG. 6, write access to the memory module 10 of the memory device 9 can be prevented. By sending a first combination of input signals to the deactivation circuit 3 using the control inputs 8, the control line 8d can be disabled. For example, one could send the high voltage signal to the control line 8d and a low voltage signal to the second control line 8e. Such a combination of control signals would not be used in normal operations as indicating a write operation without activating the memory device 9 because is not a useful combination for the control unit 2.

Once the deactivation circuit 3 has been activated and the control input 8d controlling the write access to the memory module 10 has been disabled, no further write access to the memory device 9 is possible.

In the case where both control inputs 8d and 8e receive a high voltage signal to indicate that the memory device 9 is selected for write access, the disabling of the control input 8d masks out the control signal from the write access control input 8d for the control unit 2. Consequently, the electronic switch 13 does not switch the voltage input from the reading voltage 14a to the writing voltage 14b. Because the reading voltage 14a is typically lower than the writing voltage 14b, the contents of the memory module 10 cannot be changed. In this way, the memory device 9 ignores a writing command sent to it and executes a reading command instead. The reading command does not change the state of the memory device 9, thus this memory device 9 does not react to the provided command, as desired for the present invention.

FIG. 7 shows a fifth embodiment of the present invention. An integrated circuit 1 comprises a processor 5. The processor 5 is connected to two control inputs 8a and 8b and at least one input 6 for the provision of program instructions. The processor 5 comprises four sequences of micro-operations 15, a instruction translation table 16 and a instruction decoder 17.

In the exemplary embodiment described here, the processor 5 is capable of executing three different user instructions #1, #2 and #3 and two control instructions #a and #b. The instructions are selected by the instruction decoder 17 in response to a combination of control signals received from the two control inputs 8a and 8b and program instructions received from the input 6. From the received control signals the instruction decoder 17 generates a call to one of the user instructions #1, #2 or #3. This call is provided to the instruction translation table 16, which maps the user instructions #1, #2 and #3 to the address of a sequence of micro-operations 15.

Figure 7A:
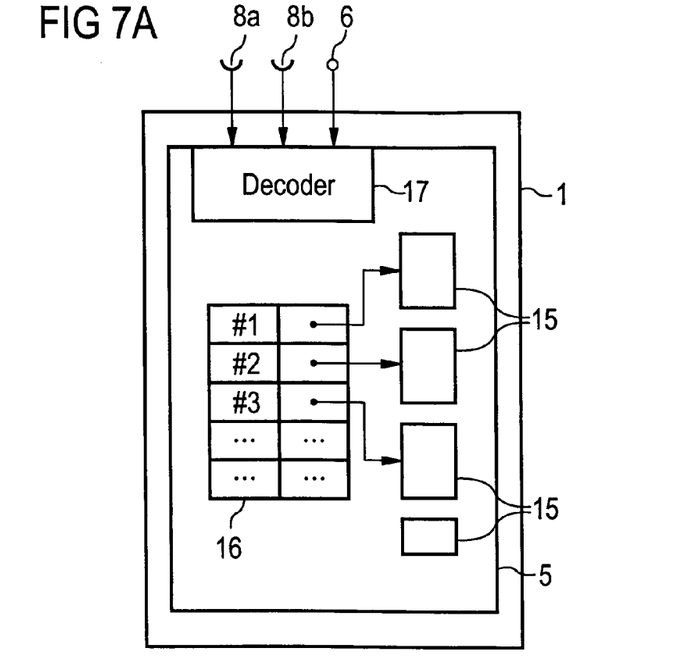
FIGS. 7a and 7b, shows a schematic diagram of a fifth embodiment of the present invention in which the execution of program instructions can be prevented by changing an address translation table.
Figure 7B:
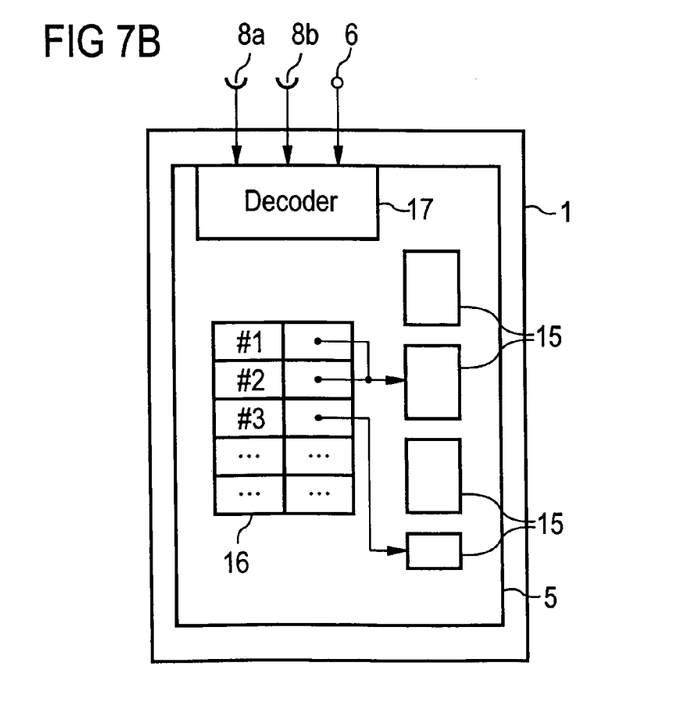

In FIG. 7A each user instruction #1, #2, and #3 is mapped to a different sequence of micro-operations. However, the instruction decoder 17 is configured to change the contents of the instruction translation table 16 in response to the first control instruction #a received from the input 6. FIG. 7B shows the mapping of the instruction translation table 16 after the instruction decoder 17 has received this first control instruction #a. Now the user instructions #1 and #2 are mapped to the same sequence of micro-operations 15. The user instruction #3 is mapped to an empty sequence of micro-operations 15, which in effect disable the user instruction #3.

In this way the effect of the control signals provided by both the control inputs 8a and 8b and the input 6 for providing program instruction to the processor 5 can be altered or disabled in accordance with the present invention. For example, one could map a user instruction #1 used for over-writing the contents of a memory cell to the sequence of micro-operations 15 used for reading the content of the same cell. As in the last embodiment, such an alternation of the execution mechanism would result in the desired disabling of the write operation #1. In another example one could map the user instruction #3 used for deleting the content of parts or all of a memory module (not shown) to an empty sequence of micro-operations 15. As a consequence the delete user instruction #3 would not be executed and is effectively disabled as desired by one object of the present invention.

The second control instruction #b can be used to re-enable the previously disabled sequence of micro-operations 15 originally associated with the user instructions #1 and #3. Once it is received by the instruction decoder 17, the original state of the instruction translation table 16 is restored.

Such an embodiment can be used, for example, in a procedure for post-production testing. The integrated circuits or DUTs are arranged in an array set-up as described above.

In a first phase, all DUTs are enabled together and issued the same user instruction, which is executed by all DUTs in parallel.

In a second phase, each DUT is enabled individually by providing a predefined combination of control signals to the row and column in which the DUT under examination is placed. The result of the DUT is verified, e.g., by reading a value from a status register of the DUT or reading and comparing the content of a predefined memory cell of the DUT with an expected result value.

If the test succeeds, i.e., if the read value and the expected value are equal, the currently enabled DUT is disabled and the next DUT, for example the DUT in the same row but one column to the right, is enabled and the process is repeated.

If, however, a test fails for a DUT, the current DUT remains enabled and the first control instructions #a, which is used to change the address translation table 16 of the DUT, is issued to the currently enabled DUT. Then the process is resumed as before, i.e., the current DUT is disabled and the next DUT is enabled and tested.

Once all DUTs have been tested and either passed this test or failed it with the subsequent change of their address translation table 16, a next test run can be performed on the DUTs. For example, if in a first test all bits of a memory device 9 were set to 0, in a second test all bits of a memory device 9 could be set to 1.

Again all DUTs are enabled together by selecting the control outputs of the test controller connected to all columns and rows of the test array. However, because the user instruction #1 used for over-writing the contents of the memory devices 1, which already failed the first test are disabled, these DUTs will not react to the user instruction #1 issued, i.e., overwrite the content of a memory device 1 with a new bit pattern. Instead, they will not react to the user instruction #1 and preserve their current state, for example for a further failure analysis.

What is claimed is:

1. An integrated circuit comprising:
   a control unit;
   a deactivation circuit;
   a plurality of control inputs for the provision of simultaneous control signals to said control unit and said deactivation circuit; and
   wherein said deactivation circuit is coupled to the control inputs for receiving said control signals from at least one of said control inputs, said deactivation circuit operating independently of the control unit and said deactivation circuit disabling the provision of at least one of said control signals to the control unit in response to an indication received from at least one of said control inputs.

2. The integrated circuit according to claim 1, wherein the provision of at least one of said control signals to the control unit is disabled by said deactivation circuit when a first predefined pattern of control signals is received at the control inputs.

3. The integrated circuit according to claim 1, wherein the deactivation circuit operates to re-enable the at least one of the control signals that was disabled by said deactivation circuit.

4. The integrated circuit according to claim 3, wherein the deactivation circuit operates according to a predefined pattern of input signals that are received at the control inputs.

5. The integrated circuit according to claim 1, wherein said integrated circuit is embodied in a non-volatile memory device.

6. An integrated circuit embodied in a non-volatile memory device, comprising:
   a control unit;
   a plurality of control inputs for the provision of control signals to said control unit; and
   a deactivation circuit coupled to the control unit, the deactivation circuit for disabling the provision of at least one of said control signals to the control unit based upon an indication received at least one of said control inputs, and such that altering of content already stored in said memory device is prevented by said disabling.

7. The integrated circuit according to claim 6, wherein the deactivation circuit disables the provision of the at least one of said control signals such that storing of new content in said memory device is prevented by said disabling.

8. An integrated circuit comprising:
   a processor;
   a plurality of control inputs for the provision of simultaneous control signals to said processor;
   a deactivation circuit for disabling the provision of at least one of said control signals to the processor, said deactivation circuit being controlled by said processor; and
   an input separate from said plurality of control inputs for receiving program instructions for said processor, said program instructions being executable by said processor, wherein the provision of at least one of said control signals to the processor is disabled by said deactivation circuit when a first predefined program instruction is executed by said processor.

9. The integrated circuit according to claim 8, wherein the provision of said control signal disabled by said deactivation circuit is re-enabled when a second predefined program instruction is executed by said processor.

10. The integrated circuit according to claim 8, wherein said integrated circuit is embodied in a non-volatile memory device.

11. An integrated circuit embodied in a non-volatile memory device comprising:
- a processor;
- a plurality of control inputs for the provision of control signals to said processor;
- a deactivation circuit for disabling the provision of at least one of said control signals to the processor, said deactivation circuit being controlled by said processor such that altering content already stored in said memory device is prevented by said disabling; and
- an input for receiving program instructions for said processor, said program instructions being executable by said processor, wherein the provision of at least one of said control signals to the processor is disabled by said deactivation circuit when a first predefined program instruction is executed by said processor.

12. The integrated circuit according to claim 11, wherein the deactivation circuit disables the provision of the at least one of said control signals such that storing of new content in said memory device is prevented by said disabling.

13. An integrated circuit comprising:
- a control unit;
- a plurality of control inputs for providing simultaneous control signals to said control unit;
- a control register for storing a control value, said control register being controlled by said control unit; and
- a deactivation circuit, said control register controlling said deactivation circuit such that the provision of at least one of said control signals to the control unit is disabled by said deactivation circuit when a first predefined value is stored in said control register.

14. The integrated circuit according to claim 13, wherein said control register further controls said deactivation circuit such that the provision of the at least one of said control signals to the control unit is re-enabled by said deactivation circuit when a second predefined value is stored in said control register.

15. The integrated circuit according to claim 13, wherein said integrated circuit further comprises a non-volatile memory, and said value of said control register is stored in said non-volatile memory.

16. The integrated circuit according to claim 13, wherein said integrated circuit is embodied in a non-volatile memory device.

17. An integrated circuit embodied in a non-volatile memory device, comprising:
- a control unit;
- a plurality of control inputs for providing control signals to said control unit;
- a control register for storing a control value being controlled by said control unit; and
- a deactivation circuit, said control register controlling said deactivation circuit such that the providing of at least one of said control signals to the control unit is disabled by said deactivation circuit when a first predefined value is stored in said control register, such that altering of content already stored in said memory device is prevented by said disabling.

18. The integrated circuit according to claim 17, wherein the deactivation circuit disables the providing of at least one of said control signals such that storing of new content in said memory device is prevented by said disabling.

* * * * *